Jan. 1, 1957 W. R. KEARNEY ET AL 2,775,895

AUTOMATIC RADIO TUNING MEANS

Filed June 28, 1954 3 Sheets-Sheet 1

INVENTORS
William R. Kearney &
BY Bertram A. Schwarz
Robert C. Fowler
ATTORNEY

AUTOMATIC RADIO TUNING MEANS

INVENTORS
William R. Kearney &
Bertram A. Schwarz
BY
Robert E. Fowler
ATTORNEY

Jan. 1, 1957 W. R. KEARNEY ET AL 2,775,895

AUTOMATIC RADIO TUNING MEANS

Filed June 28, 1954 3 Sheets-Sheet 3

INVENTORS
William R. Kearney &
Bertram A. Schwarz
BY Robert E. Fowler
ATTORNEY

United States Patent Office 2,775,895

Patented Jan. 1, 1957

2,775,895

AUTOMATIC RADIO TUNING MEANS

William R. Kearney and Bertram A. Schwarz, Kokomo, Ind., assignors to General Motors Corporation, Detroit, Mich., a corporation of Delaware Application June 28, 1954, Serial No. 439,624

7 Claims. (Cl. 74—10.52)

This invention relates to tuning means for radio receiving apparatus and more particularly for automatic tuning means of the type identified as "signal seeking" or "signal tuned" radio means. In this type of radio tuning apparatus some means is provided for causing the tuning means of the receiver to scan the frequency band for which the latter is designed. During this scanning process as various resonant signals are tuned in, a stopping pulse is developed and taken from a portion of the amplifier to actuate mechanical means for indexing or stopping the tuner on that station. Various electrical circuits have been developed which produce such a stopping pulse, and providing a control pulse to a relay and a specific circuit means for doing so is not herein directly involved. As an example of an electrical circuit developing a stopping pulse which could be used, reference is made to Tynan Patent No. 2,614,213.

It is an object in making the present invention to devise novel means for driving the tuning mechanism of a radio receiver repetitively over a frequency band.

It is a further object in making this invention to provide means for driving radio tuning means over a predetermined band including slip coupling means incorporated in the drive to permit accurate indexing, the inertia of certain parts to be absorbed in slippage.

It is a still further object in making this invention to provide energizable means for automatically driving radio tuning means repetitively over a frequency band or manually operable at will.

It is a still further object in making this invention to provide radio tuning means driven by a small motor through a transmission, the latter also being engageable by and driven by a manually turnable shaft.

With these and other objects in view which will become apparent as the specification proceeds, my invention will be best understood by reference to the following specification and claims and the illustrations in the accompanying drawings in which:

In general, the present construction consists of a small electric motor which drives gearing connected to cam means, the cam follower of which is affixed to reciprocable sliding means carrying permeability tuning cores for changing the inductance of inductance coils in the resonant circuits of a radio receiver to tune the same over the band. The small motor drives a slip coupling which in turn transmits energy to a shaft carrying a worm. This worm, through a transmission set of gears, drives a cam and this cam engages a follower connected to a reciprocable carriage upon which are mounted comminuted iron cores, whose reciprocation changes the inductance of certain coils.

Figure 4:
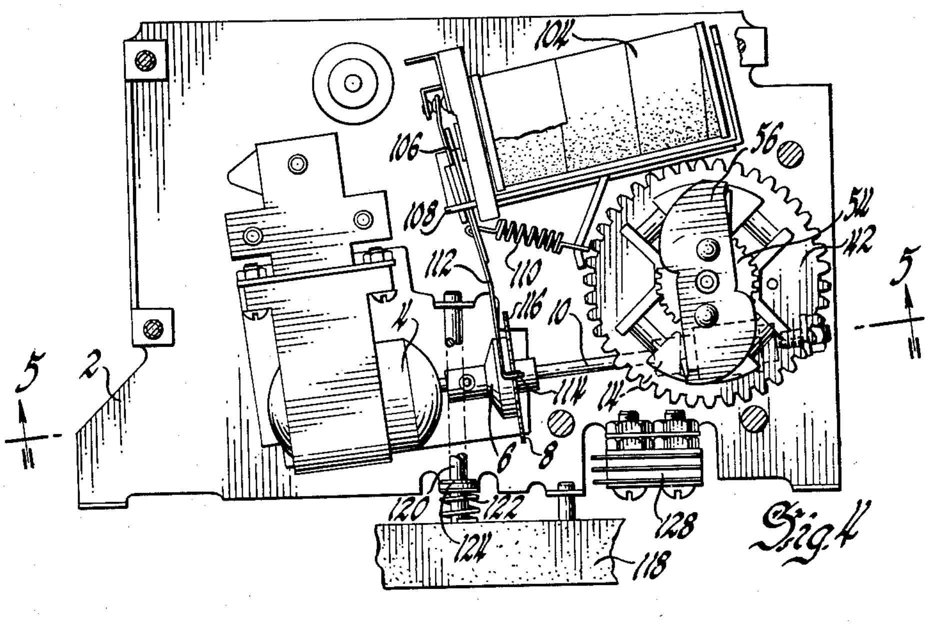
Figure 4 is a top plan view of the tuner with upper parts removed for better disclosure of those mounted at a lower level.
Figure 5:
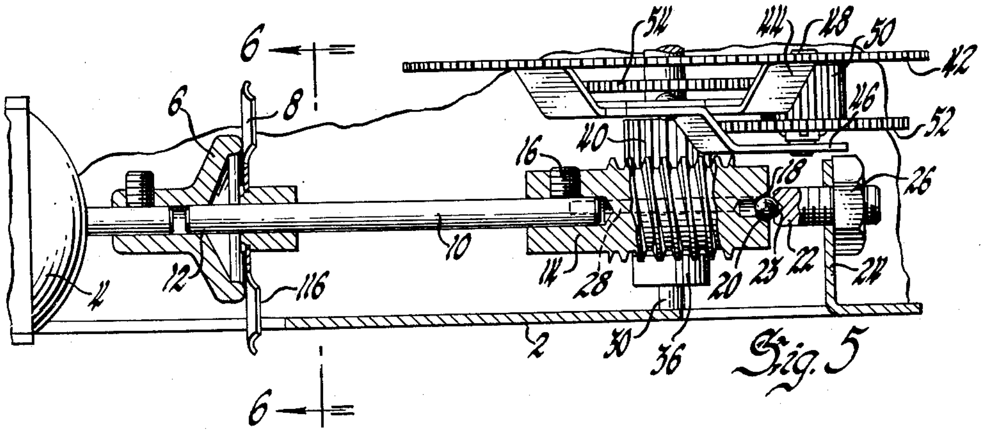
Figure 5 is an enlarged sectional view taken on line 5—5 of Figure 4.
Figure 6:
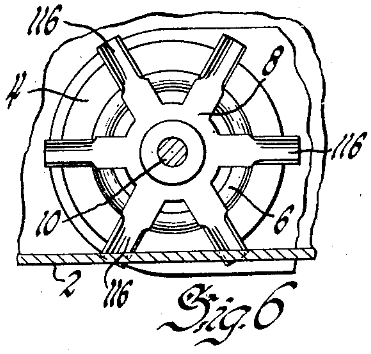
Figure 6 is a sectional view taken on line 6—6 of Figure 5.

Referring now more particularly to Figures 4 and 5, there is shown therein a base 2 upon which is mounted a small electric motor 4 whose armature is directly connected to a drive member 6 of a slip coupling. The driven member 8 of said coupling is mounted directly on the end of a drive shaft 10. The drive shaft 10 extends through the driven member 8 and into a shaft opening in the coupling member 6 which acts as a supporting bearing 12 for the left-hand end of the shaft 10 as seen in Figure 5. Shaft 10 may, of course, rotate with respect to member 6.

A worm 14 is connected directly to the right-hand end of the shaft 10 by a set screw 16. The opposite end of the worm 14 has a beveled opening 18 therein in alignment with the opening into which the shaft 10 extends and in this opening a ball bearing 20 is supported by a small stub shaft 22 threadedly mounted in an upstanding ear 24 from the base 2. The end of the shaft 22 is provided with a conical recess 23 to engage the ball bearing and force it against the end of the worm 14. A lock nut 26 is threaded onto the extending end of the stub shaft 22 to lock the latter when it is properly adjusted to clamp the ball bearing 20. Thus the motor 4 drives the worm 14 through the slip coupling 6—8 to in turn drive a worm wheel 28 loosely mounted on a vertical shaft 30 trunnioned in the base 2 and a spaced parallel supporting plate 32 above the base. The supporting plate 32 is rigidly mounted in a parallel plane to and spaced vertically from the base 2 by a series of bolts 34.

Figure 3:
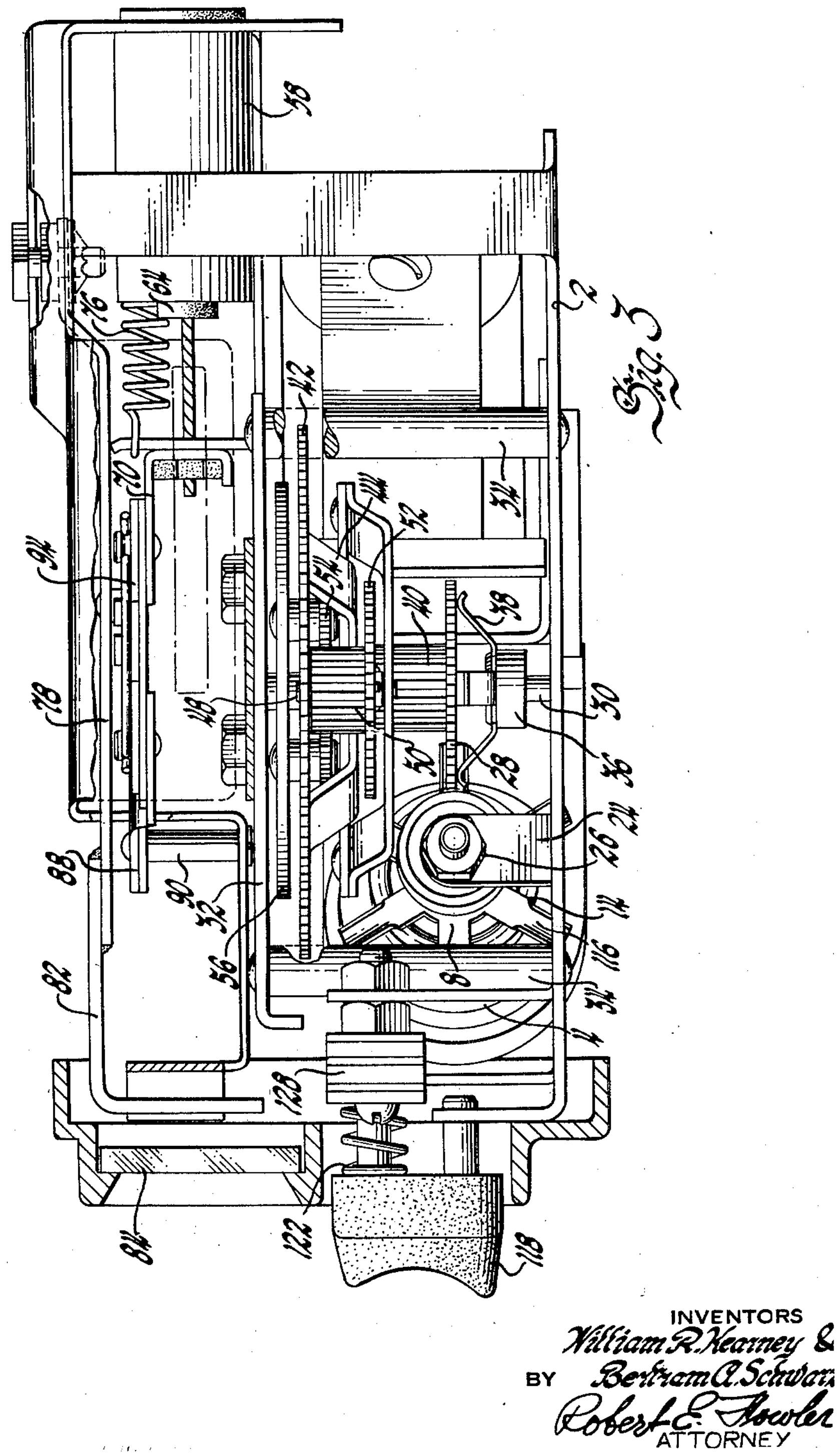
Figure 3 is an enlarged side elevation of the tuning means.

A spring spider member 36 rigidly secured to shaft 30 to rotate therewith has a plurality of spring arms 38 which bear against the side of the gear 28 to form a further slip coupling. Since the gear 28 is free and may rotate on the shaft 30, it drives the latter only through this friction coupling connection provided by the spring arms 38. Above the gear 28 and driven by the same due to pressure of the spring arms 38, as viewed in Figure 3, an elongated pinion 40 is rigidly connected to the shaft 30. Thus rotation of the gear 28 and shaft 30 will turn pinion 40.

Loosely mounted on the upper end of the shaft 30 is a large spur gear 42 which may rotate relative to the shaft. Carried on the underside of the large spur gear 42 is a planet carrier 44. Trunnioned between the planet carrier arm 46 and the spur gear 42 is a stub shaft 48 carrying thereon a pinion 50 and a gear 52, both of which are rigidly secured to the shaft 48 and the whole rotates as a unit. The gear 52 meshes with the pinion 40 and the pinion 50 meshes with a gear 54 loosely mounted to rotate about shaft 30, the gear 54 being directed connected to a 180° double lobed cam 56 which is mounted above the same. Thus, when gear 54 is rotated the cam 56 carried thereby also rotates.

The tuning means for the radio receiver in this instance is illustrated as a plurality of inductance coils 58, 60 and 62 connected in the resonant tuning circuits of the receiver, whose inductance is varied by the insertion into or the withdrawal therefrom of a series of comminuted iron cores 64, 66 and 68. All of these cores are attached to a cross bar 70 of a carriage member which reciprocates back and forth with regard to the inductance coils. The carriage rides on a rod 72 supported on the framework and is moved by the engagement of a follower 74 which engages the cam lobe 56 as the latter turns. Thus at each complete revolution of the cam lobe 56 the carriage will complete two trips from one limit of its movement to the other. A coil spring 76 having one end secured to the case and the opposite end hooked into the carriage tensions the same toward the rear and maintains the follower 74 in engagement with the side of the cam.

Figure 1:
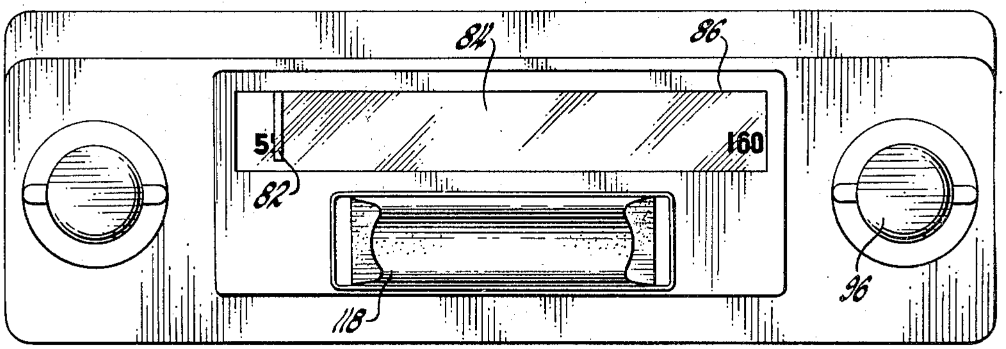
Figure 1 is a front elevational view of a radio receiver embodying our invention.
Figure 2:
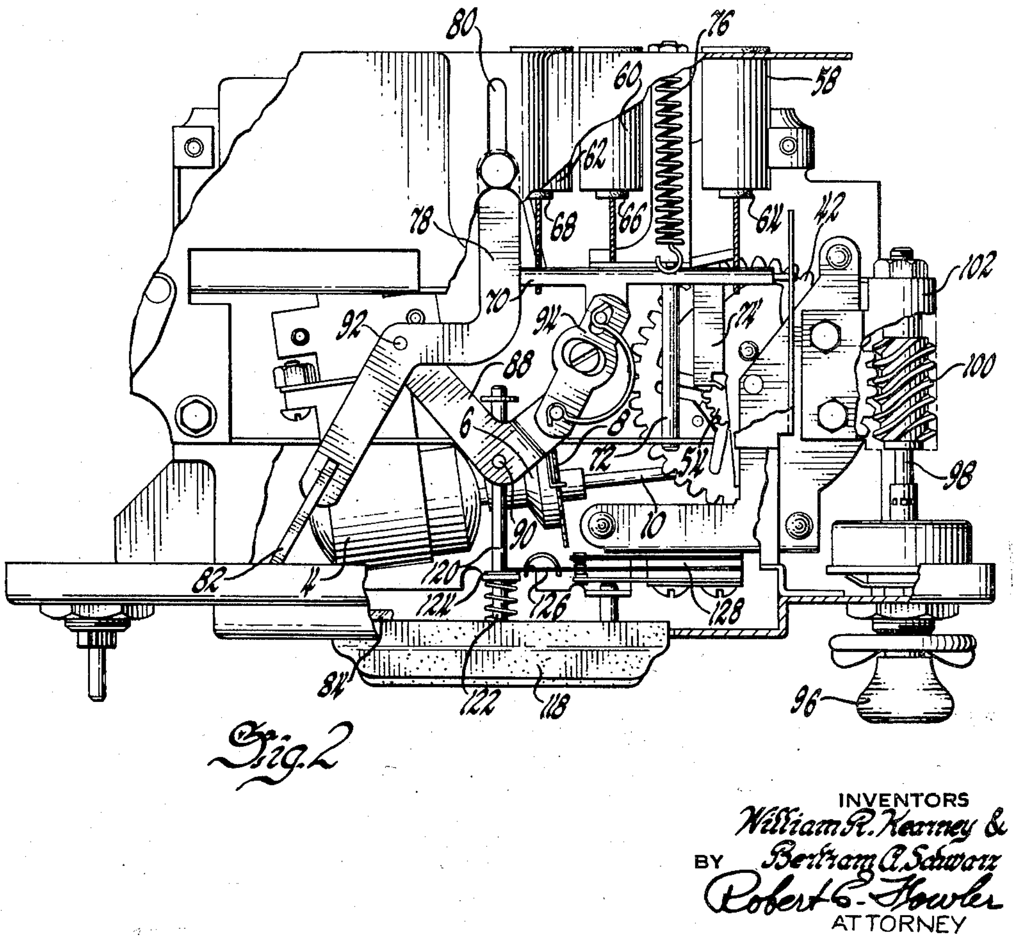
Figure 2 is a top plan view of the tuning means embodying our invention, parts being broken away and shown in section.

The position of the transverse bar 70 and its associated cores determines the frequency at which the receiver will be tuned and therefore indicating means attached thereto will provide the operator with information as to what station he is tuned. This indicating apparatus consists of an angular arm 78 lying over the top of the apparatus so far described and provided with a depending pin portion at the rear which slides in and also can rotate in a slot 80 in the frame. This angular arm 78 carries an indicating needle portion 82 at its forward end which is bent downwardly to travel over a scale 84 mounted in a long rectangular opening 86 in the forward wall. A bell crank drive 88 is pivoted at its center 90 to the frame and has its longer leg pivotally connected to the lever 78 at point 92. The other end of the bell crank lever 88 is connected through an adjustable link 94 to the carriage and cross bar 70. Thus as the cross bar moves back and forth the bell crank 88 will be rotated about its pivot 90, causing its arm 78 to be moved from the left-hand side as viewed in Figure 2 to the right-hand side and since the rear portion can slide back in slot 80 the needle 82 will follow a substantially straight line path over the scale 84.

The manual drive is provided by a knob 96 which extends from the front panel of the casing and is connected to a flexible drive shaft 98, the latter extending to and connected to a worm 100 trunnioned for rotation in a frame 102 supported from the main frame. The worm 100 meshes with gear 42 to turn the latter when it is desired to tune manually.

Thus, when the motor 4 is energized, rotation of the armature shaft of the same drives coupling member 6 to in turn drive member 8 and shaft 10 to turn worm 14. Rotation of worm 14 is transferred to gear 28 which drives shaft 30 through the friction coupling provided by the spring arms 38. This rotates pinion 40 which meshes with gear 52 to drive the latter and simultaneously therewith the pinion 50 which is connected thereto. Since the manual worm 100 engages the periphery of the large spur gear 42, that is locked in position at this time and the planetary 44 and shaft 48 prevented from moving around shaft 30. Therefore, rotation of the pinion 50 will drive gear 54 which is directly connected to the lobed cam 56 and cause the latter to rotate. As the cam 56 rotates, follower 74 will be gradually forced outwardly moving the transverse bar 70 to tune the receiver. This drive continues until the transverse bar 70 has reached the outer extremity of its travel, at which point the follower passes to a quick return portion of the cam and the spring 76 pulls the carriage back to its innermost position at which time any further rotation causes a repetition of the movement of the carriage.

If, on the other hand, it is desired to manually tune the receiver, rotation of the knob 96 turns the worm wheel 100 to cause rotation of the large gear 42. At this time the remainder of the gears lock pinion 40 in place so that as the large gear 42 rotates, it carries with it the planetary carriage causing the sun gears 50 and 52 to rotate around gear 40. Thus gear 52 will rotate to drive gear 54 and turn the lobed cam for any desired tuning position. It is thus obvious that there has been provided both a motor drive and manual means for tuning the receiver.

When the motor is driving the tuning means to cause the same to scan, means are provided to index or stop the tuning means upon receipt of an incoming signal. This signal or stopping pulse is applied to a control relay coil 104 which is mounted on the frame and which is provided with an armature 106 pivoted about point 108 and spring biased by spring 110 to a position away from the attracting coil. Armature 106 is also provided with an extension 112, which extension has a detent or angled end 114 which is adapted to engage with the various annularly spaced radial arms 116 of the coupling member 8. Thus when the relay coil 104 is energized, armature 106 will be attracted, overcoming the spring 110 to pull the detent 114 away from the arms 116 of the member 8, and allow the shaft 10 to turn under power from the motor 4. However, upon the receipt of an incoming signal to cause deenergization of the relay coil 104, detent 114 will immediately be released to enter the space between two of the projecting arms 116 of the member 8 and stop that member from further rotation. The inertia of the motor armature and the driving coupling member 6 can be absorbed in slippage of the friction coupling whereas the remainder of the gearing which is light will be immediately stopped to give an accurate index for the tuning means.

In order to energize coil 104 so that it will withdraw its detent 114 and permit the set to be tuned in to the next station in the band, there is provided a switch 118 which is mounted in the front wall of the tuner on a reciprocating rod 120 and spring biased outwardly by a coil spring 122. A fixed operating washer 124 is mounted on the shaft to not only act as an anchor for one end of the coil spring 122, but also engage the operating arm 126 of a snapover switch 128 which completes a circuit to energize the coil 104 and eenrgize motor 4 when bar 118 is forced inwardly and will remain in that position even though the switch bar 118 is released to cause the tuner to remain energized and pass on to the next station.

We claim:

1. In radio receiving apparatus having variable means for tuning said apparatus over a predetermined band of frequencies, movable means upon which the variable means is mounted, a cam, means on the movable means engaging said cam so that rotation of the same will move the movable means, planetary gear means connected to the cam to drive the same, a motor, means connecting said motor to the planetary gear means to drive the same and manual means connected to the planetary gear means to alternatively drive the same.

2. In radio receiving apparatus having variable tuning means for tuning said apparatus over a predetermined frequency band, movable means upon which the variable means is mounted, a gear train operatively connected to the movable means to move the same, said gear train including a planetary portion, a motor drive operatively connected to said gear train, a manual drive operatively connected to said gear train beyond the planetary portion so that either the manual means or the motor may move the movable means, the other acting as a reactance point for the planetary portion, slip coupling means interconnected between the motor and the gear train to provide for relative movement of the two parts, stopping indexing means engageable with a part of the coupling to lock the same against rotation and relay means for controlling the stopping indexing means.

3. In radio receiving apparatus having variable tuning means for tuning said apparatus over a predetermined frequency band, movable means upon which the variable means is mounted, cam means engaging said movable means, a gear connected to said cam for driving the same, a planetary assembly operatively connected to said gear to drive the same, manual means engageable with one portion of the planetary assembly to drive the gear, a motor, a coupling including two parts frictionally engaged, one part being connected to said motor and the other operatively connected to another portion of the planetary assembly so that the motor may move with respect to the planetary assembly, and indexing stopping means engageable with the coupling part attached to the planetary assembly so that upon engagement of the stopping means with the driven coupling part the motor may coast to a stop but the tuning means will be stopped at once.

4. In radio receiving apparatus having variable tuning means for tuning said apparatus over a predetermined frequency band, movable means upon which the variable means is mounted, cam means engaging said movable means, a gear connected to said cam for driving the same, a planetary assembly operatively connected to said gear to drive the same, manual means engageable with one portion of the planetary assembly to drive the gear, an energizable motor, a coupling connected to said motor having a driving and a driven part, spaced angular arms on the driven part, connecting means between the driven part and planetary assembly to drive the latter and indexing stopping means engageable with the arms of the driven coupling part to stop the movable means but permit the motor to coast to a stop.

5. In radio receiving apparatus having variable tuning means for tuning said apparatus over a predetermined frequency band, movable means upon which the variable means is mounted, cam means engaging said movable means, a gear connected to said cam for driving the same, a planetary assembly operatively connected to said gear to drive the same, manual means engageable with one portion of the planetary assembly to drive the gear, an energizable motor, a worm connected to and driven by said motor, a worm wheel meshing with said worm, slip coupling means interconnecting said worm wheel with the planetary assembly to drive the movable means and tune the apparatus, a second slip coupling located between the motor and worm and indexing means engageable with a part of the second slip coupling to stop the tuning means in response to a signal.

6. In radio receiving means having variable tuning means for tuning said apparatus over a predetermined frequency band, movable means upon which the variable tuning means is mounted, driving means operatively connected to said movable means, a planetary assembly operatively connected to said driving means to drive the same, manual means engageable with one portion of the planetary assembly to drive the same, an energizable motor, slip coupling means connecting the motor to the planetary assembly for driving the latter, said slip coupling means including a plurality of parts frictionally engaged, and indexing means engageable with a part of the slip coupling means to stop the tuning means in response to a signal.

7. In radio receiving apparatus having variable tuning means for tuning said apparatus over a predetermined frequency band, movable means upon which the variable tuning means is mounted, driving means operatively connected to said movable means, compound force transmitting means having alternate reaction points connected to the driving means, manual means engageable with one portion of the force transmitting means, an energizable motor, slip coupling means connected to the motor and to the force transmitting means to drive the latter, said slip coupling means including a plurality of parts frictionally engaged, and indexing means engageable with a part of the slip coupling means to stop the tuning means in response to a signal.

References Cited in the file of this patent

UNITED STATES PATENTS

| | | |
|---|---|---|
| 2,536,409 | Altman | Jan. 2, 1951 |
| 2,572,965 | Akemann | Oct. 30, 1951 |